United States Patent [19]
Backhouse et al.

[11] 3,869,702
[45] Mar. 4, 1975

[54] STUD MOUNT FOR LIGHT EMISSIVE SEMICONDUCTOR DEVICES

[75] Inventors: Geoffrey Howard Backhouse, Bishop Stortford; Norman Derek Leggett, Hoddesdon, both of England

[73] Assignee: International Standard Electric Corporation, New York, N.Y.

[22] Filed: Oct. 10, 1973

[21] Appl. No.: 404,968

[30] Foreign Application Priority Data

Jan. 30, 1973 Great Britain ...................... 4683/73

[52] U.S. Cl. ........................ 357/74, 357/17, 357/80, 357/81

[51] Int. Cl. ............................ H01l 3/00, H01l 5/00

[58] Field of Search ................ 317/234, 1, 4, 3, 4.1, 317/235, 27

[56] References Cited

UNITED STATES PATENTS

| | | | |
|---|---|---|---|
| 2,749,488 | 6/1956 | Mayer | 317/235 N |
| 2,969,487 | 1/1961 | Bourassa | 357/74 |
| 3,408,732 | 11/1968 | Smith et al. | 317/234 G |
| 3,421,203 | 1/1969 | Ullman et al. | 317/234 G |
| 3,508,100 | 4/1970 | Tillays et al. | 357/17 |
| 3,560,275 | 2/1971 | Kressel et al. | 317/235 N |
| 3,647,579 | 3/1972 | Ladany | 317/235 N |
| 3,651,564 | 3/1972 | Glass | 317/234 G |
| 3,739,241 | 6/1973 | Thillays | 317/234 H |

*Primary Examiner*—Andrew J. James
*Attorney, Agent, or Firm*—John T. O'Halloran; Menotti J. Lombardi, Jr.; Vincent Ingrassia

[57] ABSTRACT

This invention relates to a stud mount for light emissive semiconductor devices such as GaAs lasers. A copper block serving as one terminal connection for the semiconductor device is secured to one face of a steel stud. From the second face of the steel stud extends a hollow stem through which a wire, serving as the second connection for the semiconductor device, passes. The copper heat sink provides better dissipation and is shaped to allow the laser to lie on the axis of the mount.

4 Claims, 4 Drawing Figures

STUD MOUNT FOR LIGHT EMISSIVE SEMICONDUCTOR DEVICES

BACKGROUND OF THE INVENTION

This invention relates to stud mounts for light emissive semi-conductor devices, and more particularly to a stud mount for GaAs lasers.

One of the problems encountered in the operation of such semiconductor devices is that of thermal dissipation, and hence a mounting of low thermal impedance is desirable.

SUMMARY OF THE INVENTION

It is an object of the present invention to provide a stud mount for light emissive semiconductor devices which provides a low thermal impedance.

According to a broad aspect of the invention there is provided a light emissive semiconductor device mount comprising a steel stud having a hole therein; a copper block secured to one face of said stud providing one terminal connection for said semiconductor device; a hollow stem protruding from the opposite face of said stud; a wire passing throuough said hollow stem and said hole providing the other connection for said semiconductor device; and means for electrically insulating said wire in said hollow stem.

The above and other objects of the present invention will be more clearly understood from the following detailed description taken in conjunction with the accompanying drawings, in which:

DESCRIPTION OF THE PREFERRED EMBODIMENT

Figure 2:
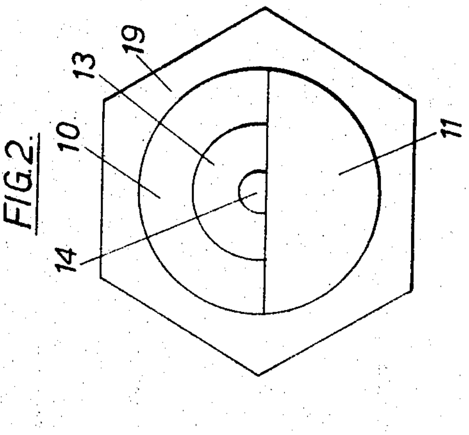
FIG. 2 is an end view of the mount.
Figure 1:
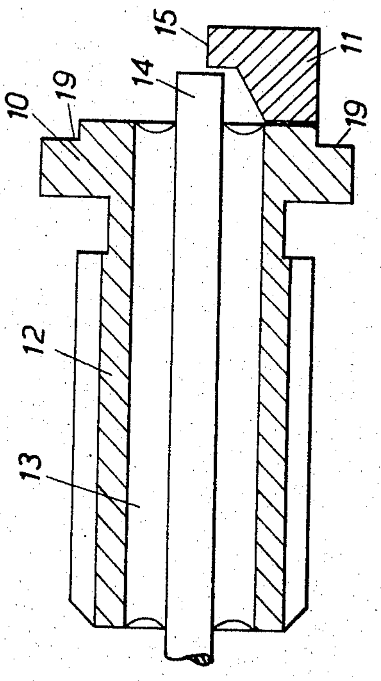
FIG. 1 shows the mount sectioned along its axis.

Referring to FIGS. 1 and 2, a mount for a laser consists of a lead-free steel stud 10 to one face of which is brazed a substantially semi-cylindrical copper block 11 and from the other face of which protrudes a hollow externally threaded stem 12. A glass seal 13 secures a wire 14 centrally in the hollow stem 12 so that the wire projects a small distance beyond the face of the stud to which the block 11 is secured. The block 11 is provided with a small recess providing clearance for the end of the wire. The axis of the curved surface of the copper block 11 is aligned with the common axis of the stem 12 and wire 14. The copper block itself is just less than a semi-cylinder so that its face 15 is displaced from the axis by an amount which will cause a laser die mounted thereon to lie on-axis. The mount is gold-plated after the brazing on of the block 11 to the stud 10.

Figure 3:
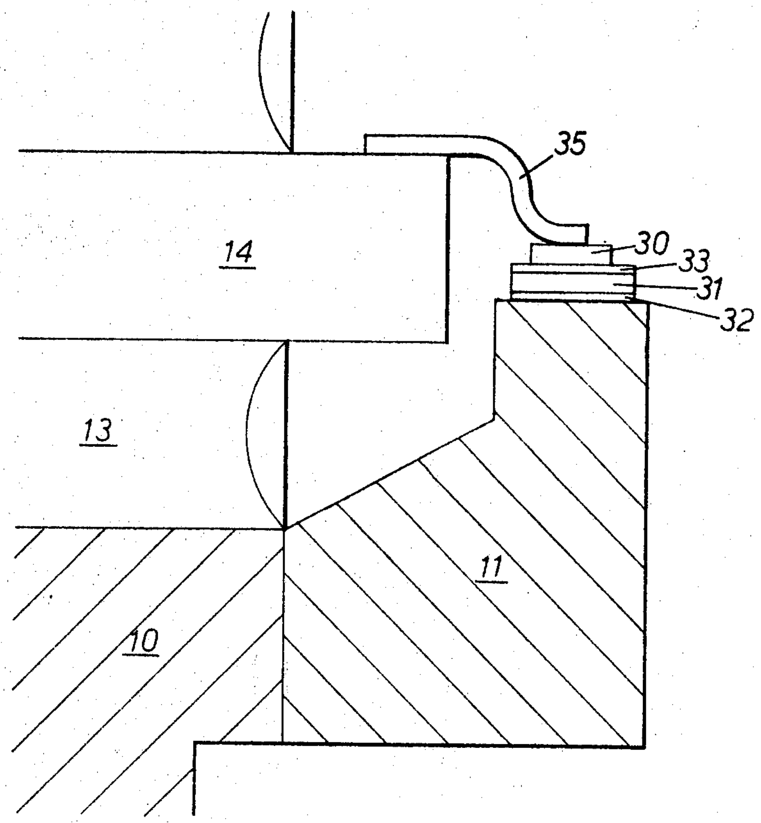
FIG. 3 depicts on a larger scale a portion of the mount with a laser die in position.

FIG. 3 shows how to heterostructure GaAs laser die 30 is mounted on the mount. The laser die 30 is first bonded to a plated molybdenum preform 31 and then the assembly of laser and preform is soldered to the copper block 11. The molybdenum preform 31 is plated with a layer 32 of gold on the side adjacent the block 11, and with a layer 33 of copper on the side adjacent the die 30. This copper layer 33 is covered with a layer of titanium then a layer of gold and finally a layer of tin. The laser die is coated on its *p*-type side with a layer of a gold/zinc alloy and on its *n*-type side with a layer of a gold/tin alloy. In each case the alloy layer is covered with a layer of silver. On the side adjacent the preform 31 the silver layer is covered with a gold layer for thermal bonding with the tin layer of the preform, whereas on the side of the die remote from the preform the silver layer is covered with a layer of aluminum for ultrasonic bonding. A double heterostructure laser die is bonded with its *p*-type side adjacent the preform, whereas a single heterostructure laser die is bonded with its n-type side adjacent the preform. The thermal bonding of the laser to the preform is carried out in an atmosphere of nitrogen and at a temperature of about 260°C and then the preform is soldered to the block at a lower temperature. Connection between the wire 14 and the other side of the die is then made by ultrasonically bonding in position one or more aluminum wire straps 35.

Figure 4:
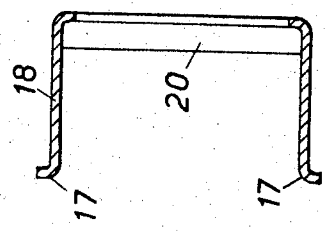
FIG. 4 shows a cap which when fitted to the mount provides a hermetic enclosure for the laser die.

A hermetically sealed enclosure for the laser die is then made by welding the rim 17 of a cap 18 (FIG. 4) to a flange 19 (FIGS. 1 and 2) on the stud. The cap 18 is provided with a plane glass window 20.

It is to be understood that the foregoing description of specific examples of this invention is made by way of example only and is not to be considered as a limitation on its scope.

What is claimed is:

1. A light emissive semiconductor device mount comprising:

a steel stud having a hole therein;

a hollow stem protruding from the opposite face of said stud;

a wire passing through said hollow stem and said hole providing the other connection for said semiconductor device;

means for electrically insulating said wire in said hollow stem; and a substantially semi-cylindrical copper block secured to one face of said stud and having a recess therein spacing it away from the end of said wire, wherein said semiconductor device is secured to said copper block and lies on the common axis of said stud and said hollow stem, said block providing one terminal connection for said semiconductor device.

2. A light emissive semiconductor device mount according to claim 1 wherein said means is a glass seal.

3. A light emissive semiconductor device mount according to claim 1 wherein said semiconductor device is electrically connected to said wire by at least one aluminum wire strap.

4. A light emissive semiconductor device mount according to claim 1 further including a cap with a transparent window is secured to said stud to form a hermetically sealed enclosure for said semiconductor device.

* * * * *